United States Patent
Ahn (10) Patent No.: US 10,483,228 B2
(45) Date of Patent: *Nov. 19, 2019

(54) APPARATUS FOR BONDING SEMICONDUCTOR CHIP AND METHOD FOR BONDING SEMICONDUCTOR CHIP

(71) Applicant: PROTEC CO., LTD., Gyeonggi-do (KR)

(72) Inventor: Geunsik Ahn, Seoul (KR)

(73) Assignee: PROTEC CO., LTD., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/011,648

(22) Filed: Jun. 19, 2018

(65) Prior Publication Data

US 2018/0366433 A1 Dec. 20, 2018

(30) Foreign Application Priority Data

Jun. 20, 2017 (KR) .................. 10-2017-0077722

(51) Int. Cl.
*H01L 21/30* (2006.01)
*H01L 21/46* (2006.01)
*H01L 23/00* (2006.01)

(52) U.S. Cl.
CPC .......... *H01L 24/742* (2013.01); *H01L 24/11* (2013.01); *H01L 24/17* (2013.01); *H01L 24/75* (2013.01); *H01L 24/81* (2013.01); *H01L 2224/753* (2013.01); *H01L 2224/75261* (2013.01); *H01L 2224/81203* (2013.01); *H01L 2224/81224* (2013.01); *H01L 2224/83203* (2013.01); *H01L 2224/83224* (2013.01)

(58) Field of Classification Search
CPC ....... H01L 24/742; H01L 24/11; H01L 24/17; H01L 24/75; H01L 24/81; H01L 24/83; H01L 24/92; H01L 25/50
USPC ........................................ 438/455
See application file for complete search history.

(56) References Cited

U.S. PATENT DOCUMENTS

| 6,394,158 | B1 | 5/2002 | Momeni |
| 7,464,850 | B2 | 12/2008 | Kim |
| 2007/0037318 | A1* | 2/2007 | Kim ............ B23K 26/0643 438/106 |
| 2009/0035891 | A1 | 2/2009 | Kim |
| 2016/0049381 | A1 | 2/2016 | Ryu et al. |

FOREIGN PATENT DOCUMENTS

| JP | H0660092 | 8/1994 |
| JP | 2001148403 | 5/2001 |
| KR | 100662820 | 12/2006 |
| KR | 20070019811 | 2/2007 |
| KR | 20080079885 | 9/2008 |

(Continued)

*Primary Examiner* — David S Blum
(74) *Attorney, Agent, or Firm* — JCIPRNET (57) ABSTRACT

Provided are a semiconductor chip bonding apparatus and a semiconductor chip bonding method, and more particularly, to an apparatus and method of bonding a semiconductor chip to an upper surface of a substrate or another semiconductor chip. According to the semiconductor chip bonding apparatus and the semiconductor chip bonding method, productivity may be increased by quickly and accurately bonding a semiconductor chip to a substrate or another semiconductor chip.

9 Claims, 6 Drawing Sheets

(56) References Cited

FOREIGN PATENT DOCUMENTS

| KR | 20080101329 | | 11/2008 |
|----|-------------|---|---------|
| KR | 20080101329 A | * | 11/2008 |
| TW | 546721 | | 8/2003 |
| TW | 200525666 | | 8/2005 |
| TW | 201401392 | | 1/2014 |
| TW | 201430971 | | 8/2014 |

* cited by examiner

FIG. 6

APPARATUS FOR BONDING SEMICONDUCTOR CHIP AND METHOD FOR BONDING SEMICONDUCTOR CHIP

CROSS-REFERENCE TO RELATED APPLICATION

This application claims the benefit of Korean Patent Application No. 10-2017-0077722, filed on Jun. 20, 2017, in the Korean Intellectual Property Office, the disclosure of which is incorporated herein in its entirety by reference.

BACKGROUND

1. Field

One or more embodiments relate to a semiconductor chip bonding apparatus and a semiconductor chip bonding method, and more particularly, to an apparatus and method of bonding a semiconductor chip to an upper surface of a substrate or another semiconductor chip.

2. Description of the Related Art

As electronic products are becoming compact, a semiconductor chip in a flip-chip form in which no wire bonding is used is widely used. A semiconductor chip in the form of a flip chip as above includes a plurality of electrodes in the form of solder bumps on a lower surface of the semiconductor chip, and the semiconductor chip is bonded to a substrate by bonding the electrodes to locations corresponding to those of solder bumps which are also formed on the substrate. In addition, in the case of a semiconductor chip in the form of a through silicon via (TSV), a semiconductor chip is stacked on another semiconductor chip (chip-on-chip) to bond solder bumps of upper and lower semiconductor chips.

As a method of bonding a thin semiconductor chip to a substrate or another semiconductor chip, a thermal compression bonding (TCB) method is used according to the related art. In the TCB method, a bonding head including a heater that heats a semiconductor chip is used to adsorb an upper surface of the semiconductor chip to thereby place the semiconductor chip on a substrate, and then the semiconductor chip is heated while pressurizing the semiconductor chip. When the semiconductor chip is heated, bonding is performed as solder bumps on the semiconductor chip or the substrate are melted. After heating the semiconductor chip, by using the bonding head, up to a temperature at which the solder bumps are melted, the semiconductor chip needs to be maintained in a pressurized state by using the bonding head until the solder bumps are hardened again. Here, operation of the heater of the bonding head is stopped to decrease the temperature of the semiconductor chip.

As described above, the semiconductor chip has to be maintained in a pressurized state by using the bonding head during heating and cooling of the semiconductor chip in the TCB method, and thus, an operation time thereof is long. In addition, as a thermal conduction method is used to heat the semiconductor chip by using the bonding head, a relatively long period of time takes to heat the semiconductor chip and cool the semiconductor chip again. Generally, several tens or more seconds takes to bond a semiconductor chip by using the TCB method.

Moreover, due to a relatively long time of heating of the semiconductor chip, the semiconductor chip is also damaged.

SUMMARY

One or more embodiments include a semiconductor chip bonding apparatus and a semiconductor chip bonding method, in which a semiconductor chip may be bonded to a substrate or another semiconductor chip quickly and stably.

Additional aspects will be set forth in part in the description which follows and, in part, will be apparent from the description, or may be learned by practice of the presented embodiments.

According to one or more embodiments, a semiconductor chip bonding apparatus includes: a fixing member configured to fix a lower surface of a plurality of chip-substrate assemblies in which a non-conductive resin layer and a semiconductor chip are sequentially stacked on a substrate; a pressing member arranged above the fixing member, the pressing member including a transparent portion through which a laser beam penetrates; a lifting member configured to lift or lower one of the fixing member and the pressing member relative to the other of the fixing member and the pressing member to pressurize semiconductor chips of the plurality of chip-substrate assemblies such that solder bumps of one of the semiconductor chips and the substrate penetrate the non-conductive resin layer to electrically contact the other of the semiconductor chips and the substrate; and a laser head configured to irradiate the laser beam to the chip-substrate assemblies pressurized by using the pressing member, through the transparent portion of the pressing member, so as to bond solder bumps of one of the semiconductor chips and the substrate to the other of the semiconductor chips and the substrate.

According to one or more embodiments, a semiconductor chip bonding method includes: (a) forming a non-conductive resin layer on one of a lower surface of a semiconductor chip and an upper surface of a substrate; (b) disposing the semiconductor chip on the substrate to provide a plurality of chip-substrate assemblies in which the substrate, the non-conductive resin layer, and the semiconductor chip are sequentially stacked; (c) fixing the plurality of chip-substrate assemblies by using a fixing member by disposing the plurality of chip-substrate assemblies on the fixing member; (d) making one of a pressing member and the fixing member draw near the other of the pressing member and the fixing member by using a lifting member such that solder bumps of one of the semiconductor chip and the substrate penetrate the non-conductive resin layer to be in electrical contact with the other of the semiconductor chip and the substrate, wherein the pressing member is disposed above the fixing member and includes a transparent portion through which a laser beam penetrates; and (e) bonding solder bumps of one of the semiconductor chip and the substrate to the other of the semiconductor chip and the substrate by irradiating a laser beam to the chip-substrate assemblies between the pressing member and the fixing member by using a laser head through the transparent portion of the pressing member.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION

Hereinafter, a semiconductor chip bonding apparatus according to an embodiment of the present disclosure will be described in detail with reference to the attached drawings.

Figure 1:
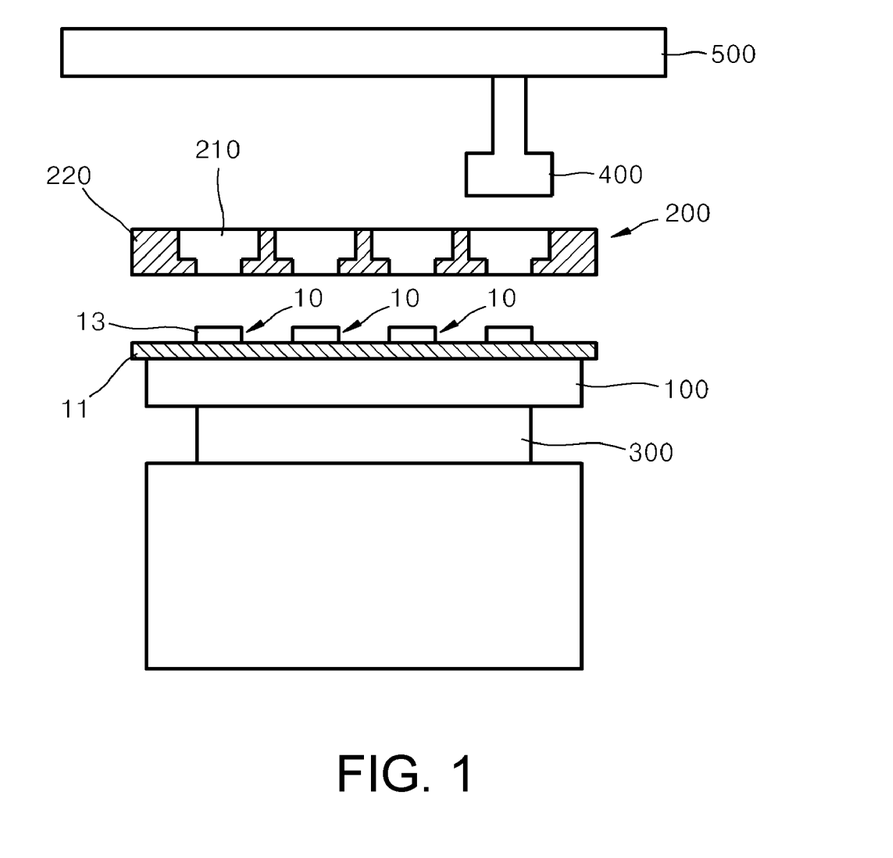
FIG. 1 is a conceptual diagram of a semiconductor chip bonding apparatus according to an embodiment of the present disclosure.
Figure 2:
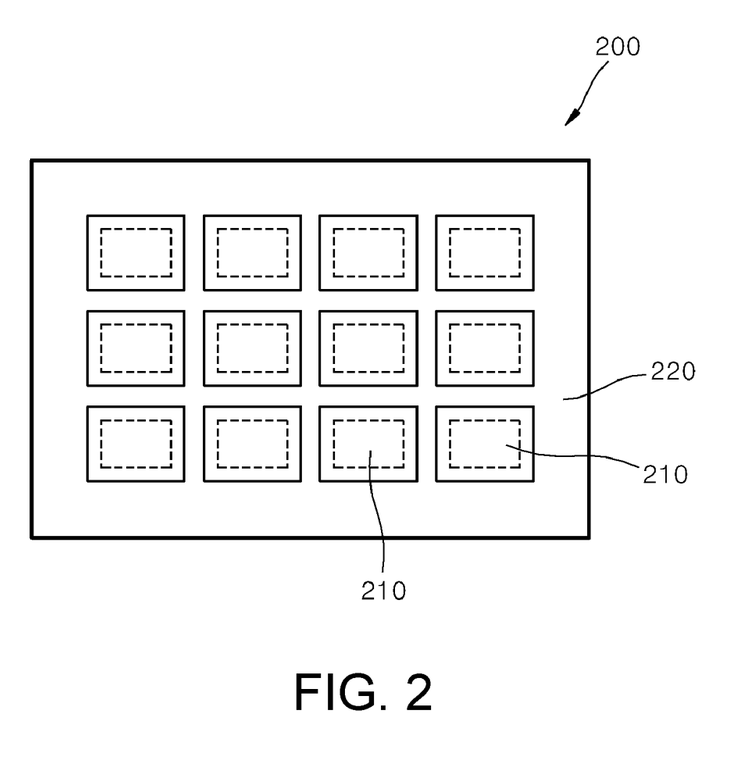
FIG. 2 is a plan view of a pressing member of the semiconductor chip bonding apparatus illustrated in FIG. 1.
Figure 3:
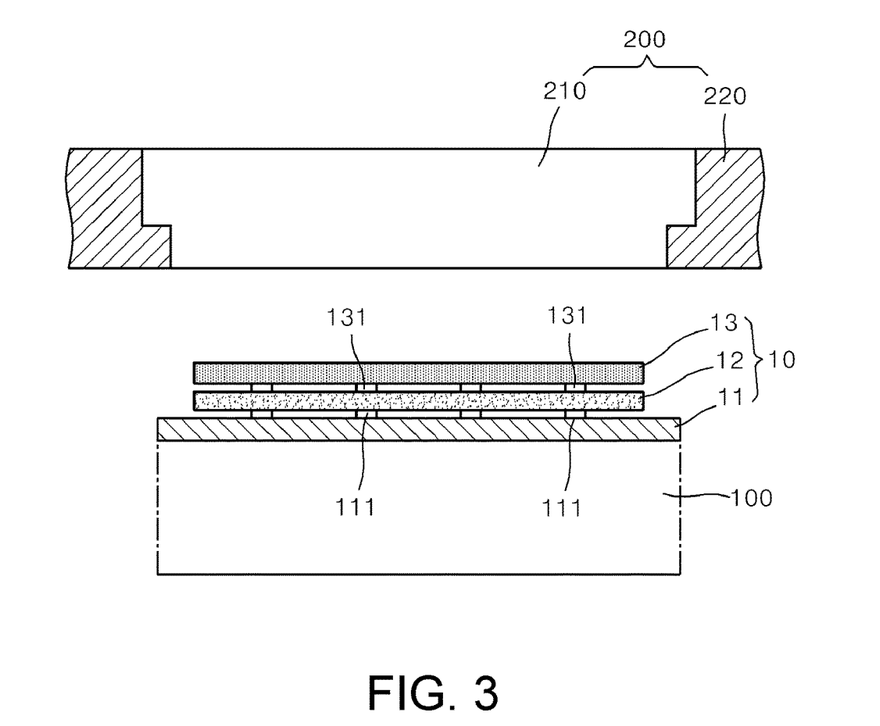
FIGS. 3 and 4 illustrate an example of a chip-substrate assembly bonded by using the semiconductor chip bonding apparatus illustrated in FIG. 1.

FIG. 1 is a conceptual diagram of a semiconductor chip bonding apparatus according an embodiment of the present disclosure, and FIG. 2 is a plan view of a pressing member 200 of the semiconductor chip bonding apparatus illustrated in FIG. 1. FIG. 3 illustrates an example of a chip-substrate assembly 10 bonded by using the semiconductor chip bonding apparatus illustrated in FIG. 1.

The semiconductor chip bonding apparatus according to the present embodiment is an apparatus for bonding a semiconductor chip 13 to a substrate 11 by using a laser beam or bonding a semiconductor chip 13 manufactured in the form of a through silicon via (TSV), by stacking the semiconductor chips 13 on top of one another. Hereinafter, first, an example in which the semiconductor chip 13 is bonded to the substrate 11 will be described.

Solder bumps 111 and 131 are respectively formed on the substrate 11 and the semiconductor chip 13, and as the solder bumps 111 and 131 are instantaneously melted by an energy transferred by the laser beam and then hardened, the semiconductor chip 13 is bonded to the substrate 11. Here, a non-conductive resin layer 12 and the semiconductor chip 13 are sequentially stacked on the substrate 11 as illustrated in FIG. 3. That is, the non-conductive resin layer 12 is disposed between the substrate 11 and the semiconductor chip 13. The non-conductive resin layer 12 may be a non-conductive film (NCF) or a non-conductive paste (NCP). When an NCF is used, the semiconductor chip 13 is stacked on the substrate 11 while the NCF is attached to an upper surface of the substrate 11 or a lower surface of the semiconductor chip 13. When an NCP is used, the NCP is coated on an upper surface of the substrate 11, and then the semiconductor chip 13 is stacked on the substrate 11. In the present embodiment, a chip-substrate assembly 10 in which the non-conductive resin layer 12 in the form of an NCF attached to the lower surface of the semiconductor chip 13 is formed will be described as an example.

Referring to FIGS. 1 and 2, the semiconductor chip bonding apparatus according to the present embodiment includes a fixing member 100, the pressing member 200, a lifting member 300, and a laser head 400.

The fixing member 100 is an apparatus for fixing a lower surface of a plurality of chip-substrate assemblies 10. In the present embodiment, a bonding operation performed on the chip-substrate assemblies 10 in which substrates 11 of the plurality of chip-substrate assemblies 10 are connected to one another will be described as an example.

The fixing member 100 according to the present embodiment fixes the substrate 11 by supporting a lower surface of the substrate 11 by using a vacuum absorption method. The chip-substrate assembly 10, in which the semiconductor chips 13 are arranged on the non-conductive resin layer 12 in accordance with positions where solder bumps 111 of the substrate 11 are formed, is supplied to the fixing member 100 and is fixed by adsorption. Due to viscosity or adhesive properties of the non-conductive resin layer 12, the semiconductor chips 13 are temporarily adhered to the substrate 11. Unless a relatively large amount of vibration or a relatively great external force is applied, the semiconductor chip 13 disposed on the substrate 11 are not shaken by operation of the non-conductive resin layer 12 but are maintained in their positions.

The pressing member 200 is disposed above the fixing member 100. Referring to FIG. 2, the pressing member 200 includes a transparent portion 210 and a mask portion 220. The transparent portion 210 may be formed of a transparent material through which a laser beam penetrates. Quartz which is widely used to transmit a laser beam may be used as a material of the transparent portion 210. The mask portion 220 may be formed of an opaque material through which a laser beam cannot penetrate. The mask portion 220 is configured to support the transparent portion 210. Referring to FIG. 3, the transparent portions 210 are arranged in areas to respectively correspond to the semiconductor chips 13 of the chip-substrate assembly 10 in a one-on-one manner, wherein the chip-substrate assembly 10 is fixed by using the fixing member 100 below the transparent portions 210.

The mask portion 220 is configured to support the transparent portions 210 in a planar manner. In addition, the mask portion 220 is formed of an opaque material. The mask portion 220 is disposed in a corresponding area between the chip-substrate assemblies 10. The mask portion 220 prevents a laser beam from passing through regions other than the transparent portions 210. A lower surface of the transparent portions 210 is planar. When pressing the semiconductor chips 13 of the chip-substrate assembly 10 by using the pressing member 200 via operation of the lifting member 300, which will be described later, the semiconductor chips 13 are pressurized uniformly and flatly via the transparent portions 210 having a flat lower surface.

The lifting member 300 performs a function of vertically lifting up and down the fixing member 100. While the substrate 11 of the chip-substrate assembly 10 is adsorbed by and fixed to the fixing member 100, the lifting member 300 lifts up the fixing member 100 to closely contact with the fixing member 100 to the pressing member 200, thereby pressurizing the semiconductor chips 13 of the chip-substrate assembly 10. When the lifting member 300 pressurizes the fixing member 100 against the pressing member 200, the solder bumps 131 of the semiconductor chip 13 and the solder bumps 111 of the substrate 11 penetrate the non-conductive resin layer 12 to electrically contact each other.

The laser head 400 is disposed above the pressing member 200. The laser head 400 generates a laser beam and transmits the laser beam to the semiconductor chips 13 below the transparent portions 210 of the pressing member 200 through the transparent portions 210 of the pressing member 200. As the solder bumps 111 of the substrate 11 and the solder bumps 131 of the semiconductor chips 13 are instantaneously melted by an energy transferred by the laser beam, the semiconductor chips 13 are bonded to the substrate 11.

The laser head 400 is mounted on a head transporting member 500. The head transporting member 500 transports the laser head 400 in a horizontal direction. From above the pressing member 200, the laser head 400 may transmit a laser beam simultaneously to a plurality of transparent portions 210 or may sequentially irradiate a laser beam to each of the transparent portions 210. The head transporting member 500 may transport the laser head 400 to a location where a laser beam is to be irradiated.

Hereinafter, a semiconductor chip bonding method for bonding the semiconductor chips 13 to the substrate 11 by using the semiconductor chip bonding apparatus according to the present embodiment configured as described above will be described.

First, an NCF is attached to a lower surface of the semiconductor chip 13 to form a non-conductive resin layer 12 (step (a)). As described above, the NCF may also be attached to an upper surface of the substrate 11. In the present embodiment, an example in which the non-conductive resin layer 12 is formed by attaching an NCF to a lower surface of the semiconductor chip 13 as illustrated in FIG. 3 will be described.

By disposing each of the semiconductor chips 13 having lower surfaces to which the non-conductive resin layer 12 is attached, on the substrate 11, a plurality of chip-substrate assemblies 10 in which the substrate 11, the non-conductive resin layer 12, and the semiconductor chip 13 are sequentially stacked are provided (step (b)). Referring to FIG. 1, a plurality of chip-substrate assemblies 10 provided by a plurality of non-conductive resin layers 12 and a plurality of semiconductor chips 13 stacked on one substrate 11 are illustrated. FIG. 3 illustrates an enlarged cross-sectional view of one of the plurality of chip-substrate assemblies 10. Here, the solder bumps 111 of the substrate 11 and the solder bumps 131 of the semiconductor chip 13 are arranged at positions corresponding to each other to face each other. Due to the adhesive force of the non-conductive resin layer 12, the semiconductor chip 13 is temporarily attached to the upper surface of the substrate 11.

After completing step (b), the plurality of chip-substrate assemblies 10 are arranged on the fixing member 100 as illustrated in FIGS. 1 and 3 to fix the lower surface of the substrate 11 by using the fixing member 100 (step (c)). The fixing member 100 fixes the chip-substrate assemblies 10 by adsorbing the lower surface of the substrate 11 by using a vacuum adsorption method.

Figure 4:
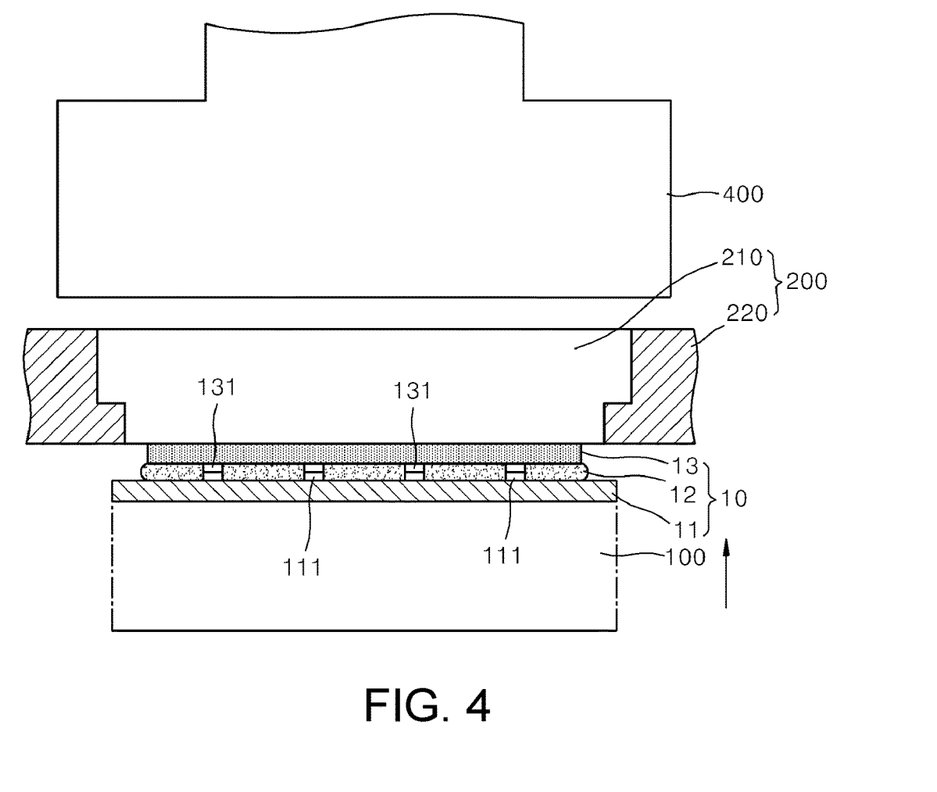

While the chip-substrate assemblies 10 are fixed to the fixing member 100, the fixing member 100 is lifted up by using the lifting member 300 to make the semiconductor chips 13 draw near the pressing member 200, thereby pressurizing the chip-substrate assemblies 10 against the substrate 11 (step (d)). According to the operation of the lifting member 300, the solder bumps 111 or 131 of one of the semiconductor chips 13 and the substrate 11 penetrate the non-conductive resin layer 12 so as to electrically contact the other of the semiconductor chips 13 and the substrate 11. According to the present embodiment, the solder bumps 131 of the semiconductor chips 13 and the solder bumps 111 of the substrate 11 respectively penetrate the non-conductive resin layer 12 to be in contact with each other as illustrated in FIG. 4. As a result, the solder bumps 131 of the semiconductor chip 13 and the solder bumps 111 of the substrate 11 are electrically connected to each other. In addition, the solder bumps 131 of the semiconductor chips 13 are electrically insulated from each other via the non-conductive resin layer 12, and the solder bumps 111 of the substrate 11 are also electrically insulated from each other via the non-conductive resin layer 12. The non-conductive resin layer 12 performs a function of dissipating heat generated in the semiconductor chips 13 and a function of mitigating impact that may be applied to the semiconductor chips 13 and the substrate 11.

In this state, the laser head 400 irradiates a laser beam to bond the solder bumps 131 of the semiconductor chips 13 and the solder bumps 111 of the substrate 11 to each other (step (e)). The laser beam irradiated from the laser head 400 is transmitted to the chip-substrate assemblies 10 via the transparent portions 210 of the pressing member 200. As the solder bumps 111 and 131 of the substrate 11 and the semiconductor chips 13 are instantaneously melted by an energy transferred by the laser beam and then hardened, the semiconductor chips 13 are bonded to the substrate 11 as illustrated in FIG. 4. While thermal deformation may occur according to an instantaneous temperature rise of the semiconductor chips 13 or the substrate 11 due to the laser beam, since the transparent portions 210 of the pressing member 200 are pressing down the semiconductor chips 13, the semiconductor chips 13 are stably bonded to the substrate 11 while preventing warping or bending of the semiconductor chips 13 due to thermal deformation. According to this method, bonding failure of the solder bumps 111 and 131 may be prevented. In addition, according to the semiconductor chip bonding apparatus and the semiconductor chip bonding method of the present embodiment, unlike a method according to the related art in which a semiconductor chip is heated using a thermal conduction method performed by using a heating block, a laser beam is used to heat the semiconductor chips 13 and the solder bumps 111 and 131, and thus, a bonding operation of the chip-substrate assemblies 10 may be performed within a very short period of time. In addition, as a direct energy transfer method of a laser beam is used instead of using a thermal conduction method, a temperature of the solder bumps 111 and 131 may be increased at a remarkably higher speed compared to the thermal conduction method, and the temperature of the solder bumps 111 and 131 may be decreased very quickly by stopping irradiation of a laser beam. By using the above-described method, a bonding operation of semiconductor chips may be performed several tens of times faster than a method of the related art, according to the apparatus and method for bonding a semiconductor chip of the present disclosure. In addition, the semiconductor chips 13 are heated only for a very short period, and thus, damage to the semiconductor chips 13 due to heat may be prevented.

As described above, the pressing member 200 includes the transparent portions 210 and the mask portion 220, and a laser beam penetrates only the transparent portions 210. Accordingly, a laser beam irradiated from the laser head 400 passes through the transparent portions 210 of the pressing member 200 and is transmitted only to the chip-substrate assemblies 10 disposed under the transparent portions 210. By using the pressing member 200 including the transparent portions 210 and the mask portion 220 as described above, irradiation of a laser beam onto a portion of the substrate 11 where transfer of energy of the laser beam is not needed may be prevented.

In addition, step (e) may also be performed such that a plurality of chip-substrate assemblies 10 are simultaneously bonded to the substrate 11 by using the pressing member 200 as described above. By increasing an irradiation area of a laser beam by operating the laser head 400, the laser beam may be irradiated onto two or more chip-substrate assemblies 10 at the same time. As the mask portion 220 of the pressing member 200 prevents a laser beam from passing through an area other than regions corresponding to the semiconductor chips 13 of the chip-substrate assemblies 10 as described above, even when the laser beam is irradiated onto a relatively broad area, an energy of the laser beam may be transferred only to the semiconductor chips 13 which are to be bonded. By simultaneously bonding the plurality of semiconductor chips 13 to the substrate 11 by using the above-described method, an overall process productivity may be improved. According to circumstances, step (e) may be performed such that all of the chip-substrate assemblies 10 pressurized by using the pressing member 200 are simultaneously bonded to the substrate 11 by irradiating a laser beam to the entire pressing member 200 as illustrated in FIG. 2.

In addition, according to circumstances, step (e) may be performed by transporting the laser head 400 by using the head transporting member 500 described above. Step (e) may be performed such that each semiconductor chip 13 is sequentially bonded to the substrate 11 at a time by transporting the laser head 400 by using the head transporting member 500. Similarly, step (e) may be performed by bonding semiconductor chips 13 of two chip-substrate assemblies 10 to the substrate 11 at a time or by irradiating a laser beam to semiconductor chips 13 of a row of the chip-substrate assemblies 10.

As described above, while the plurality of chip-substrate assemblies 10 are simultaneously pressurized by using the pressing member 200, just a region to which a laser beam is to be irradiated may be modified by increasing or reducing the region for laser beam irradiation, and thus, according to the semiconductor chip bonding apparatus and the semiconductor chip bonding method of the present disclosure, a bonding operation of the chip-substrate assemblies 10 may be quickly performed.

Meanwhile, even when not using the head transporting member 500, a bonding operation on one or a plurality of chip-substrate assemblies 10 may be sequentially performed. While the laser head 400 is fixed, when a location and area of laser beam irradiation are configured to be adjusted optically according to an internal operation of the laser head 400, step (e) may be performed by sequentially irradiating a laser beam to the chip-substrate assemblies 10 also by using the semiconductor chip bonding apparatus that includes the laser head 400 which is in a fixed state.

While the present disclosure has been described with reference to preferred embodiments, the scope of the present disclosure is not limited to the above described and illustrated structures.

For example, while it is described above that the non-conductive resin layer 12 in the form of an NCF is attached to the lower surface of the semiconductor chip 13 and then stacked on the substrate 11, according to circumstances, steps (a) and (b) may also be performed by attaching an NCF on a substrate and then disposing a semiconductor chip on the NCF.

Figure 5:
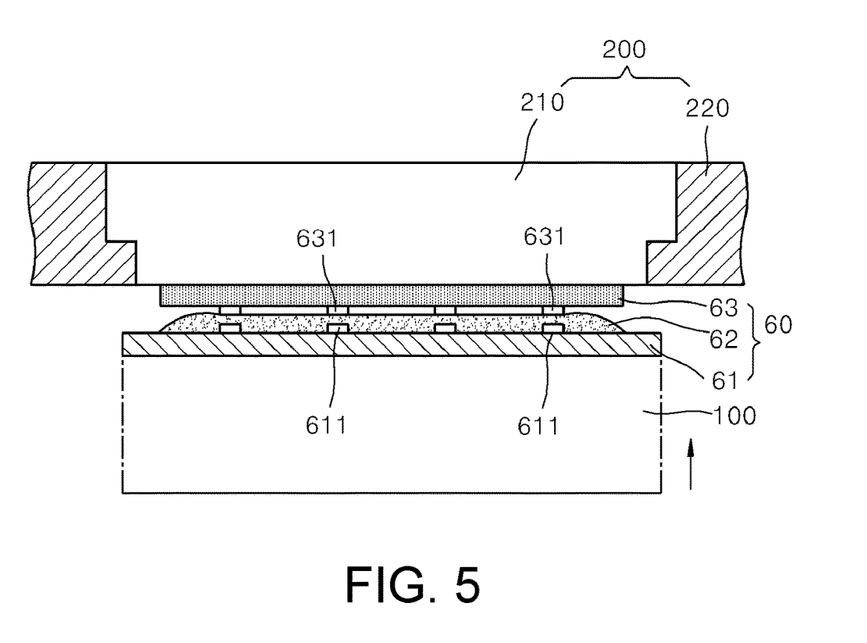
FIGS. 5 and 6 respectively illustrate other examples of a chip-substrate assembly bonded by using the semiconductor chip bonding apparatus illustrated in FIG. 1.

In addition, step (a) may be performed by coating a substrate with a non-conductive resin layer in the form of an NCP as described above. FIG. 5 is a cross-sectional view illustrating an operation in which a chip-substrate assembly 60 is completed by coating a substrate 61 with a non-conductive paste as a non-conductive resin layer 62 and then stacking a semiconductor chip 63 thereon, and the chip-substrate assembly 60 is fixed by using the fixing member 100 and the fixing member 100 is lifted up by using the lifting member 300. In this state, solder bumps 611 and 631 of the substrate 61 and the semiconductor chips 63 are bonded by using a laser beam.

In addition, while the chip-substrate assemblies 10 in which the solder bumps 111 and 131 are respectively formed on the lower surface of the semiconductor chips 13 and the upper surface of the substrate 11 have been described as an example, the semiconductor chip bonding apparatus and the semiconductor chip bonding method of the present disclosure may also be applied to chip-substrate assemblies in which solder bumps are formed only either on semiconductor chips or a substrate, and electrodes corresponding to the solder bumps are formed on the other of the semiconductor chips and the substrate. In this case, the solder bumps penetrate a non-conductive resin layer to be bonded to the corresponding electrodes.

Figure 6:
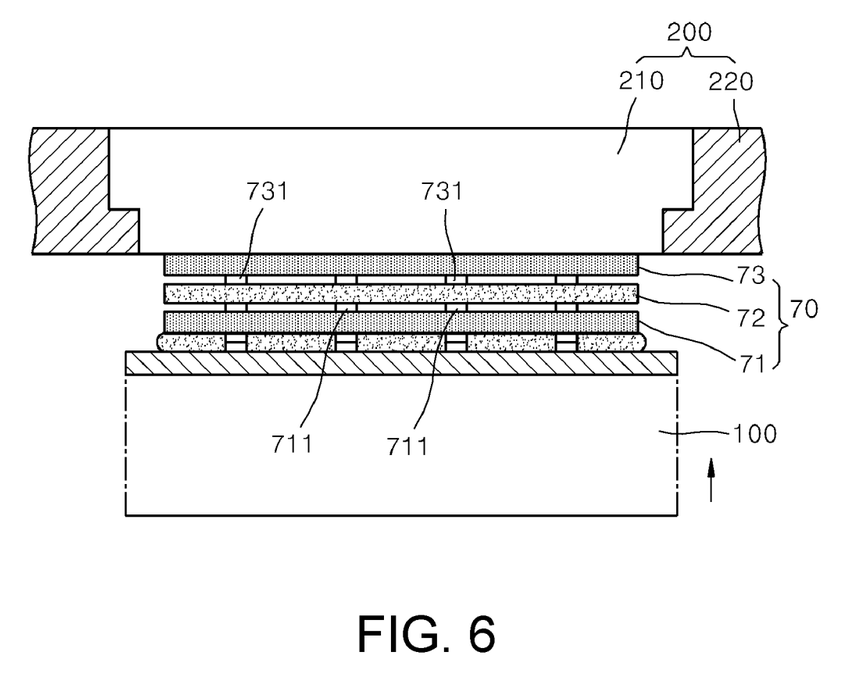

In addition, while an example in which the semiconductor chips 13 and 63 are stacked on the substrates 11 and 61 in the form of a printed circuit board (PCB) or a flexible printed circuit board (FPCB) to be bonded is described above with reference to FIGS. 3 through 5, the semiconductor chip bonding apparatus and method according to the present disclosure may also be used to stack semiconductor chips 71 and 73 manufactured as through silicon vias (TSVs) on one another and bond the adjacent semiconductor chips 71 and 73 to each other. In this case, as illustrated in FIG. 6, the semiconductor chip 73 at an uppermost position corresponds to the semiconductor chip 13 of a chip-substrate assembly 10 described above, and an assembly of a semiconductor chip below the semiconductor chip 73 above and a substrate corresponds to the substrate 11 of the chip-substrate assembly 10 described above. Here also, solder bumps 711 and 731 are bonded to each other by using a laser beam while the chip-substrate assembly 70 is pressurized such that the solder bumps 711 and 731 penetrate the non-conductive resin layer 72 to be in contact with each other.

In addition, while it is described above that the lifting member 300 lifts or lowers the fixing member 100, a semiconductor chip bonding apparatus may also be configured such that the lifting member lifts or lowers the pressing member. In this case, step (d) is performed such that, while the substrate is fixed to the fixing member, the lifting member lowers the pressing member to pressurize semiconductor chips against a substrate.

In addition, while it is described above that all of the chip-substrate assemblies 10 are bonded by simultaneously or sequentially irradiating a laser beam thereto while all of the chip-substrate assemblies 10 are simultaneously pressurized by lifting the fixing member 100 by using the lifting member 300, a semiconductor chip bonding apparatus may also be configured such that chip-substrate assemblies are grouped into a number of groups and pressurized sequentially by using a pressing member and then bonded by using a laser head. In this case, the semiconductor chip bonding apparatus according to the present disclosure further includes a fixing unit-transporting member that horizontally transports the fixing member. According to the semiconductor chip bonding apparatus configured as described above, semiconductor chips are bonded to a substrate by repeatedly performing sequentially transporting the fixing member in a horizontal direction by using the fixing unit-transporting member, lifting the fixing member by using the lifting member to pressurize some of the groups of the semiconductor chips to be bonded, by using the pressing member, and then lowering the fixing member.

In addition, while the pressing member 200 is described above as including the transparent portions 210 and the mask portion 220, a pressing member without a mask portion may also be used. In this case, the entire main portion of the pressing member may be formed of a transparent portion and used to pressurize a plurality of chip-substrate assemblies, and a laser beam may be irradiated to all of the plurality of chip-substrate assemblies.

According to the semiconductor chip bonding apparatus and the semiconductor chip bonding method of the present disclosure, a semiconductor chip may be quickly and accurately bonded to a substrate or another semiconductor chip, thereby increasing productivity.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the inventive concept as defined by the following claims.

What is claimed is:

1. A semiconductor chip bonding apparatus, comprising:
a fixing member configured to fix a lower surface of a plurality of chip-substrate assemblies in which a non-conductive resin layer and a semiconductor chip are sequentially stacked on a substrate;
a pressing member arranged above the fixing member, the pressing member comprising a transparent portion through which a laser beam penetrates;
a lifting member configured to lift or lower one of the fixing member and the pressing member relative to the other of the fixing member and the pressing member to pressurize the semiconductor chips of the plurality of chip-substrate assemblies such that solder bumps of one of the semiconductor chips and the substrate penetrate the non-conductive resin layer to electrically contact the other of the semiconductor chips and the substrate; and
a laser head configured to irradiate the laser beam to the chip-substrate assemblies pressurized by using the pressing member, through the transparent portion of the pressing member, so as to bond solder bumps of one of the semiconductor chips and the substrate to the other of the semiconductor chips and the substrate,
wherein the pressing member further comprises a mask portion that is formed of an opaque material and supports the transparent portion,
wherein the transparent portion of the pressing member is disposed in areas respectively corresponding to the plurality of chip-substrate assemblies,
wherein the mask portion is disposed in a corresponding area between the plurality of chip-substrate assemblies.

2. The semiconductor chip bonding apparatus of claim 1, wherein the laser head sequentially irradiates a laser beam to each of the plurality of chip-substrate assemblies.

3. The semiconductor chip bonding apparatus of claim 1, wherein the laser head simultaneously irradiates a laser beam to at least two of the plurality of chip-substrate assemblies.

4. The semiconductor chip bonding apparatus of claim 2, further comprising a head transporting member configured to transport the laser head.

5. A semiconductor chip bonding method, comprising:
(a) forming a non-conductive resin layer on one of a lower surface of a semiconductor chip and an upper surface of a substrate;
(b) disposing the semiconductor chip on the substrate to provide a plurality of chip-substrate assemblies in which the substrate, the non-conductive resin layer, and the semiconductor chip are sequentially stacked;
(c) fixing the plurality of chip-substrate assemblies by using a fixing member to dispose the plurality of chip-substrate assemblies on the fixing member;
(d) making one of a pressing member and the fixing member draw near the other of the pressing member and the fixing member by using a lifting member such that solder bumps of one of the semiconductor chip and the substrate penetrate the non-conductive resin layer to be in electrical contact with the other of the semiconductor chip and the substrate, wherein the pressing member is disposed above the fixing member and comprises a transparent portion through which a laser beam penetrates, wherein (d) is performed by using the pressing member comprising the transparent portion disposed in areas respectively corresponding to the plurality of chip-substrate assemblies, and a mask portion that is disposed in a corresponding area between the plurality of chip-substrate assemblies is formed of an opaque material and supports the transparent portion; and
(e) bonding solder bumps of one of the semiconductor chip and the substrate to the other of the semiconductor chip and the substrate by irradiating a laser beam to the chip-substrate assemblies between the pressing member and the fixing member by using a laser head through the transparent portion of the pressing member.

6. The semiconductor chip bonding method of claim 5, wherein (e) is performed by sequentially irradiating a laser beam to each of the chip-substrate assemblies by using the laser head.

7. The semiconductor chip bonding method of claim 5, wherein (e) is performed by simultaneously irradiating a laser beam to at least two of the chip-substrate assemblies by using the laser head.

8. The semiconductor chip bonding method of claim 5, wherein (a) is performed by stacking the non-conductive resin layer on the upper surface of the substrate while the substrate is fixed to the fixing member, and wherein (b) is performed by disposing each of a plurality of semiconductor chips on the non-conductive resin layer on the substrate after completing (a), and wherein (c) is completed by performing (a) and (b).

9. The semiconductor chip bonding method of claim 5, wherein (a) is performed by attaching the non-conductive resin layer to the lower surface of the semiconductor chip, and wherein (b) is performed by disposing the plurality of semiconductor chips, to which the non-conductive resin layer is attached in (a), on the upper surface of the substrate, while the substrate is fixed to the fixing member, and wherein (c) is completed by performing (a) and (b).

* * * * *